United States Patent [19]

Roschmann

[11] Patent Number: 4,555,374
[45] Date of Patent: Nov. 26, 1985

[54] METHOD OF MANUFACTURING A DISC RESONATOR

[75] Inventor: Peter Roschmann, Hamburg, Fed. Rep. of Germany

[73] Assignee: U.S. Philips Corporation, New York, N.Y.

[21] Appl. No.: 670,086

[22] Filed: Nov. 9, 1984

Related U.S. Application Data

[63] Continuation-in-part of Ser. No. 189,286, Sep. 22, 1980, abandoned.

[30] Foreign Application Priority Data

Oct. 17, 1979 [DE] Fed. Rep. of Germany ....... 2941994

[51] Int. Cl.[4] .................. H01F 1/34; C30B 33/00; C30B 29/28
[52] U.S. Cl. .................. 264/40.1; 252/62.57; 264/157; 264/158; 264/235; 264/346
[58] Field of Search .............. 252/62.57; 264/158, 264/346, 157, 235, 40.1

[56] References Cited

U.S. PATENT DOCUMENTS

| | | | |
|---|---|---|---|
| 3,613,056 | 10/1971 | Bobeck et al. | 252/62.57 |
| 3,759,745 | 9/1973 | Dixon et al. | 252/62.57 |
| 3,845,477 | 10/1974 | LeCraw | 252/62.57 |

OTHER PUBLICATIONS

"Ferromagnetic Resonance in Epitaxial $Y_3Fe_{5-x}Ga_xO_{12}$ Film", R. V. Telesin et al., Soviet Physics—Solid State, vol. 16, No. 11, pp. 2300-2301, (May 1975).

"Saturation Magnetization of Gallium-Substituted Yttrium Iron Garnet," P. Hansen et al., J. of App. Phys., vol. 45, No. 6, pp. 2728-2732, (Jun. 1974).

"Annealing Effects on Cation Distribution in Diamagnetically Substituted Single Crystal Yttrium Iron Garnet," P. Roschmann et al., IEEE Trans. of Mag., vol. Mag 14, No. 5, pp. 704-706, Sep. 1978.

Roschmann, P., et al., "Epitaxial Growth and Annealing Control of FMR Properties of Thick Homogeneous Ga Substituted Yttrium Iron Garnet Films," *Mat. Res. Bull*, vol. 18, pp. 449-459, (1983).

*Primary Examiner*—James Derrington
*Attorney, Agent, or Firm*—Marc D. Schechter

[57] ABSTRACT

A method is described for adjusting the temperature coefficient of the ferrimagnetic resonant frequency in gallium or aluminium substituted YIG disc resonators. At the compensation temperature, $T_o$, the temperature coefficient of the resonant frequency, $f_r$, in a given frequency range is approximately zero. Where this range lies, depends, inter alia, on the substitution value. By annealing the discs, $T_o$ can be moved into the desired temperature range. When the manufactured disc has a compensation temperature above the desired temperature range, annealing must be carried out at approximately 850° to 1400° C. When the manufactured disc has a compensation temperature below the desired temperature range, annealing is performed at approximately 400° to 850° C.

3 Claims, 2 Drawing Figures

METHOD OF MANUFACTURING A DISC RESONATOR

This is a continuation-in-part application of Ser. No. 189,286, filed Sept. 22, 1980, now abandoned.

BACKGROUND OF THE INVENTION

The invention relates to a method of manufacturing a disc resonator consisting of a single crystal of a magnetic garnet material having the composition $Y_3(Fe_{2-x}M_x)(Fe_{3-y}M_y)O_{12}$, where M is a nonmagnetic ion which can occupy both octahedral and tetrahedral lattice sites. The method is performed by providing a single crystal of the magnetic garnet material, and then cutting the single crystal along a given crystal direction into thin discs. The thickness-to-diameter ratio of each disc is less than approximately 0.3. Finally, the discs are annealed.

As compared with conventional spherical resonators (such as ferrimagnetic resonators used for tunable oscillators and filters in the VHF, UHF and SHF frequency ranges), disc resonators of monocrystalline yttrium-iron garnet have a few advantages in particular when gallium, aluminium or another nonmagnetic ion is substituted at both octahedral and tetrahedral lattice sites. In principle, axially magnetized disc resonators can be operated at comparatively lower resonant frequencies than spherical resonators manufactured from the same material. Furthermore, there is no coupling between ferrimagnetic resonance and degenerated magnetostatic resonance modes in the disc resonators; in spherical resonators this effect presents serious problems below approximately 1.5 GHz.

A disadvantage of YIG disc resonators, however, is the strong temperature dependence of the resonant frequency. In spherical resonators, the temperature dependence of the resonant frequency, $f_r$, can be adjusted, by choosing a suitable crystallographic orientation, to values of approximately zero for a given operating frequency range. This adjustment procedure cannot be performed on a disc resonator after the disc has been cut from the starting crystal because the resonance field, $H_Z$, must be aligned parallel to the axis of the disc. The initial choice of the sectional plane from the starting Ga:YIG crystal determines at what temperature the sign of the contribution to the temperature dependence by the anisotropy field is opposite to the sign of the contribution to the temperature dependence of the demagnetization. In Ga:YIG this is a result of the negative crystal anisotropy when the axis of the disc is along the [111] direction of the crystal. Consequently a disc resonator of this material has a substantially temperature-independent resonant frequency within a fixed (i.e. non-adjustable) temperature range.

In principle the value of the resonant frequency compensation temperature, $T_o$, of a disc resonator made from a given starting crystal can be influenced to a certain extent by choice of the ratio of the thickness, d, to the diameter, D, of the disc. However, in practice this measure can only be used to a limited extent, because both the thickness and the diameter of the disc are the main factors which determine the high frequency coupling of the disc resonator in the circuit in which it is used.

In components which include ferrimagnetic resonators, the permitted temperature behavior of the resonant frequency in the operating frequency range is fixed by various system requirements. As a result of this, the value of the total Ga substitution in a disc resonator depends upon the specification for $T_o$ and the d/D ratio; typically the Ga content must remain within a narrow range. This latter requirement for obtaining a desired $T_o$ is difficult to fulfil in practice because according to the known crystal growth methods for Ga:YIG, the Ga content can be predetermined only within a margin of approximately ±10%. As a consequence of the uncertainty of the Ga content, $T_o$ may vary by ±40° C.

SUMMARY OF THE INVENTION

It is an object of the invention to provide a method of adjusting the temperature coefficient of the resonant frequency of substituted YIG disc resonators in such a manner that the resonators have a temperature coefficient of approximately zero at a desired operating temperature.

According to the invention, this object is achieved by first determining the temperature at which an unannealed disc has a temperature coefficient of the resonant frequency of substantially zero. This is the initial compensation temperature. Next, the temperature at which the disc can be annealed without changing the initial compensation temperature is estimated. This temperature is a reference temperature. Finally, if the initial compensation temperature is above the desired operating temperature range, the disc is annealed at a temperature which is above the reference temperature. If the initial compensation temperature is below the desired operating temperature, the disc is annealed at a temperature below the reference temperature.

According to a preferred embodiment of the method according to the invention, the higher annealing temperatures are in the temperature range from approximately 850° C. to approximately 1400° C. The lower annealing temperatures are in the temperature range from approximately 400° C. to approximately 850° C.

DESCRIPTION OF THE PREFERRED EMBODIMENTS

Figure 1:
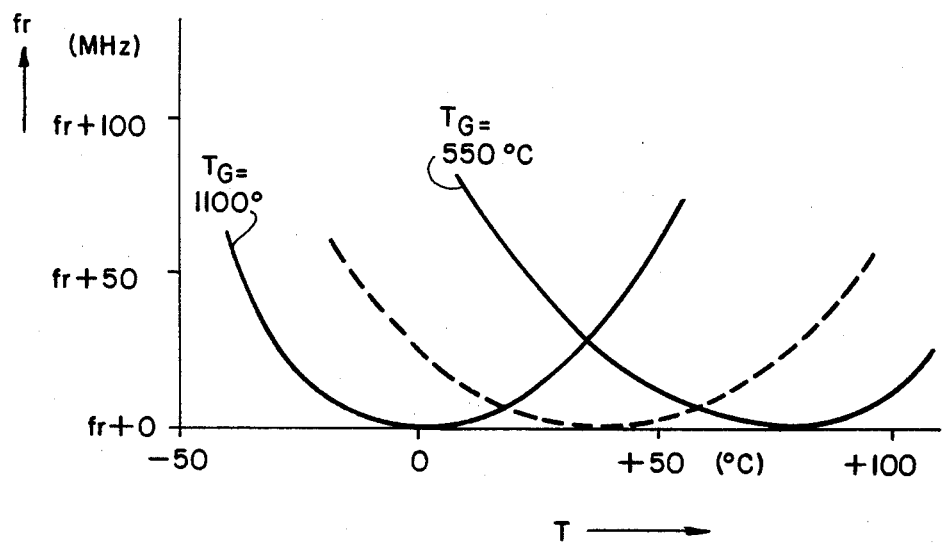
FIG. 1 shows the dependence of the resonant frequency, $f_r$, on the temperature, $T_1$ for an unannealed disc and the shift which occurs after annealing at two different temperature.

A disc having a diameter of 3 mm and a thickness of 0.1 mm was cut from a Ga:YIG starting crystal having a total Ga-substitution value of 0.88 formula units. The disc was cut in such a manner that the [111] crystal orientation extends parallel to the axis of the disc. The temperature dependence of the resonant frequency of the disc was determined from reflection measurements by means of a Wobbel generator at a constant magnetic field perpendicular to the disc. The broken line in FIG. 1 shows the variation of the resonant frequency, $f_r$, with the temperature of an unannealed disc. The solid lines show the variation of the resonant frequency with temperature after other equivalent discs had been annealed at temperatures, $T_G$, of 1100° C. or 550° C. The compensation temperature, $T_o$, of the resonant frequency was thus moved by the annealing treatments by approximately ±40° C. relative to the value $T_o \approx 40°$ C. for the unannealed disc.

Figure 2:
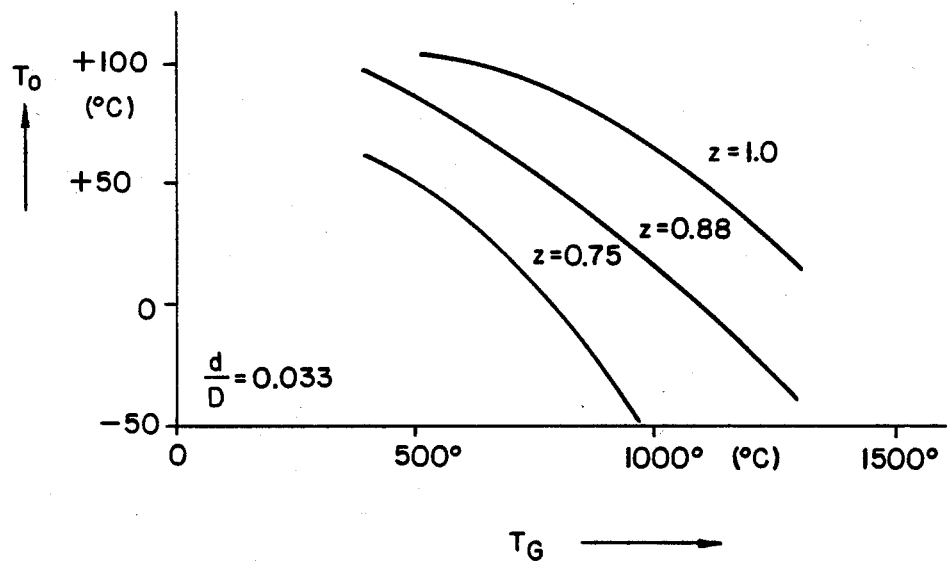
FIG. 2 shows the dependence of the compensation temperature, $T_o$, on the annealing temperature, $T_G$, for discs having different amounts of Ga substitution.

FIG. 2 shows the dependence of $T_o$ on the annealing temperature, $T_G$, for discs having $d/D=0.033$ and with total Ga-substitution values, $z$ ($z=x+y$), of 0.75, 0.88, and 1.0 formula units, respectively. The resulting changes of $T_o$ by the annealing treatments are reversible. The annealing treatment can be readily carried out in practice in the temperature range between approximately 400° C. and 1300° C. A shift of the compensation temperature, $T_o$, over more than 100° C. proves to be possible.

In the method according to the present invention, one must estimate the temperature at which the disc can be annealed without changing the initial compensation temperature. This temperature is the reference temperature.

The reference temperature can be estimated in at least two ways. The simplest is to estimate it at 850° C. for all discs. This is the middle of the effective annealing range of 400°–1300° C. This estimate has proven reasonable, in practice, for Ga:YIG discs cooled to room temperature at 50° C. per hour after termination of a flux growth process at 1100° C. to 1000° C.

Alternatively, the initial reference temperature can be estimated by measuring the compensation temperature at two or more different annealing temperatures. The initial reference temperature can then be estimated by interpolation or extrapolation.

This second estimation method has the disadvantage that it changes the reference temperature to the last annealing temperature. However, since the last annealing temperature is known, so is the new reference temperature.

The method according to the invention has the following advantages:

(a) the temperature coefficient of the resonant frequency of a disc resonator can be adjusted to substantially zero at a desired temperature $T_o$;

(b) the adjustment process is independent of the d/D ratio of the disc from the same Ga:YIG crystal, and hence the process is independent of the HF-coupling factor;

(c) the adjustment process can be used to correct for unavoidable variations in the Ga contenet of the crystals, thus increasing product yield;

(d) the adjustment process allows one to chose a desired value of $T_o$ within a temperature range up to 120° C.; and (e) the adjustment process permits one to compensate for other external temperature-dependent influences on the resonance frequency.

The advantages are important in evaluating the usefulness of YIG disc resonators in the mass production of tunable oscillators and filters in the VHF, UHF and SHF frequency ranges, in particular at operating frequencies of approximately 500 MHz to approximately 1500 MHz.

I claim:

1. A method of manufacturing a disc resonator comprising the steps of:

providing a single crystal of a magnetic garnet having the composition $Y_3(Fe_{2-x}M_x)(Fe_{3-y}M_y)O_{12}$, where M is a nonmagnetic ion which can occupy both octahedral and tetrahedral sites; and cutting the crystal into thin discs;

characterized in that in order to obtain a temperature coefficient of the resonant frequency which is approximately zero at a temperature within a desired temperature range, the method further comprises the steps of:

measuring the temperature at which the temperature coefficient of the resonant frequency of the crystal is approximately zero, this temperature being the initial compensation temperature;

estimating the temperature at which the crystal can be annealed without changing the initial compensation temperature, this estimated temperature being known as a reference temperature; and annealing the crystal at a temperature above the reference temperature if the desired temperature range is below the initial compensation temperature, or annealing the crystal at a temperature below the reference temperature if the desired temperature range is above the initial compensation temperature.

2. A method of manufacturing a disc resonator comprising the steps of:

providing a single crystal of a magnetic garnet having the composition $Y_3(Fe_{2-x}M_x)(Fe_{3-y}M_y)O_{12}$, where M is a nonmagnetic ion which can occupy both octahedral and tetrahedral sites; and cutting the crystal into thin discs;

characterized in that in order to obtain a temperature coefficient of the resonant frequency which is approximately zero at a temperature within a desired temperature range, the method further comprises the steps of:

measuring the temperature at which the temperature coefficient of the resonant frequency of the crystal is approximately zero, this temperature being the initial compensation temperature;

estimating the temperature at which the crystal can be annealed without changing the initial compensation temperature to be 850° C., this estimated temperature being known as a reference temperature; and annealing the crystal at a temperature between 850° C. and 1400° C. if the desired temperature range is below the initial compensation temperature, or annealing the crystal at a temperature between 400° C. and 850° C. if the desired temperature range is above the initial compensation temperature.

3. A method as claimed in claim 2, characterized in that this disc has a thickness-to-diameter ratio of less than approximately 0.3.

* * * * *